United States Patent
Chennupati et al.

(10) Patent No.: US 12,389,094 B2
(45) Date of Patent: Aug. 12, 2025

(54) SENSOR TEMPERATURE REDUCER FOR A SENSOR SHIFT CAMERA ARCHITECTURE

(71) Applicant: Apple Inc., Cupertino, CA (US)

(72) Inventors: Nitin Kumar Chennupati, Mountain View, CA (US); Nicholas D. Smyth, San Jose, CA (US); Julien C. Vittu, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 157 days.

(21) Appl. No.: 17/952,030

(22) Filed: Sep. 23, 2022

(65) Prior Publication Data
US 2024/0107138 A1    Mar. 28, 2024

(51) Int. Cl.
*H04N 23/52* (2023.01)
*G03B 17/55* (2021.01)
*H05K 7/20* (2006.01)

(52) U.S. Cl.
CPC ............ *H04N 23/52* (2023.01); *G03B 17/55* (2013.01); *H05K 7/20409* (2013.01)

(58) Field of Classification Search
CPC ........ H04N 23/52; H04N 23/54; G03B 17/55; H05K 7/20409
See application file for complete search history.

(56) References Cited

U.S. PATENT DOCUMENTS

| | | | |
|---|---|---|---|
| 9,253,387 B2 | 2/2016 | Furusawa et al. | |
| 9,426,362 B2 | 8/2016 | Tang et al. | |
| 9,578,217 B2 | 2/2017 | Gutierrez et al. | |
| 9,781,405 B2 | 10/2017 | Gutierrez | |
| 2006/0056049 A1* | 3/2006 | Tokiwa | H04N 23/663 348/E5.025 |
| 2008/0043139 A1* | 2/2008 | Lee | H04N 23/57 348/E5.025 |
| 2010/0245662 A1* | 9/2010 | Ishikawa | H04N 23/54 348/374 |
| 2013/0148016 A1* | 6/2013 | Oh | H04N 23/54 348/E5.026 |
| 2018/0059432 A1* | 3/2018 | Gong | G02B 27/646 |
| 2023/0314829 A1* | 10/2023 | Shikama | G02B 27/646 348/208.99 |
| 2023/0328346 A1* | 10/2023 | Shibazaki | H04N 23/54 348/374 |

OTHER PUBLICATIONS

Elias, Melanie, et al., "Assessing the Influence of Temperature Changes on the Geometric Stability of Smartphone- and Raspberry Pi Cameras," Sensors 2020, 20, 643, 22 pages.

\* cited by examiner

*Primary Examiner* — Albert H Cutler
(74) *Attorney, Agent, or Firm* — Aikin & Gallant, LLP

(57) ABSTRACT

A camera comprising: a camera enclosure; an optomechanical assembly fixedly coupled to the camera enclosure; an image sensor assembly movably coupled to the camera enclosure, the image sensor assembly comprising: a substrate, an image sensor coupled to the substrate, a flexible printed circuit board coupled to the substrate, a conductive stiffener plate coupled to the flexible printed circuit board, and a passive heat exchanger thermally coupled to the image sensor to dissipate heat away from the image sensor.

4 Claims, 7 Drawing Sheets

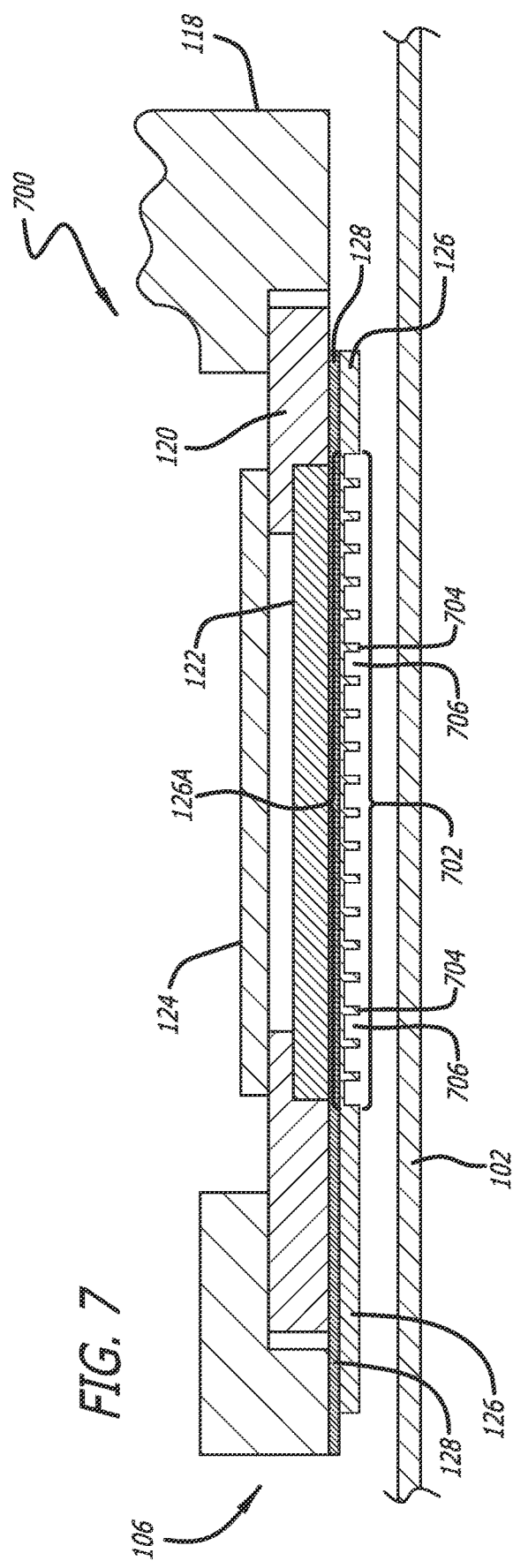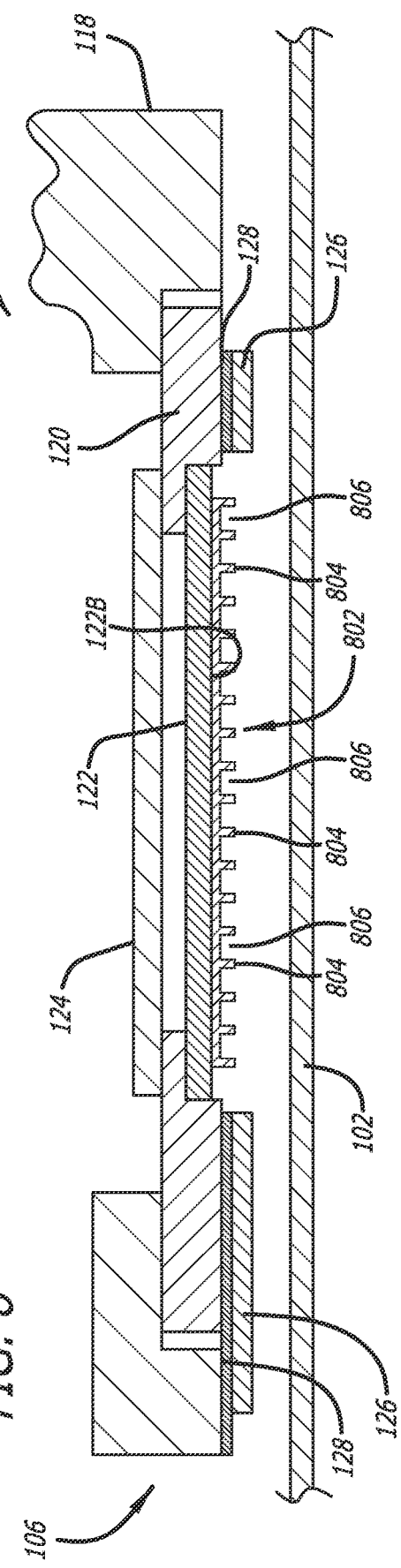

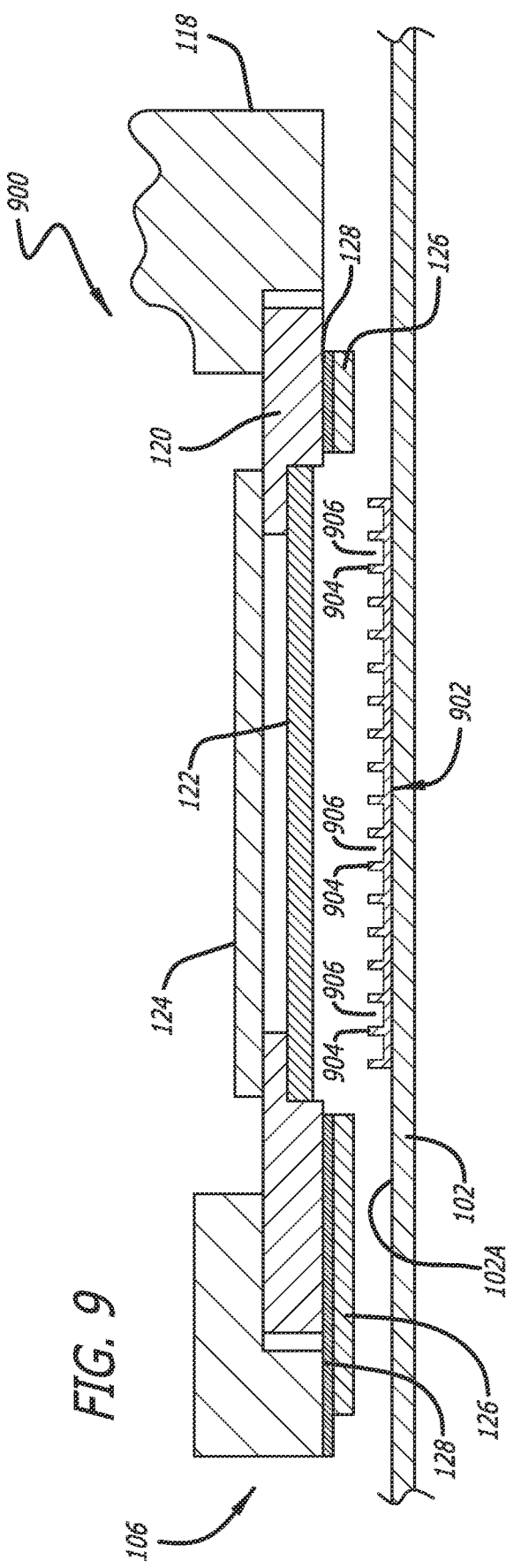
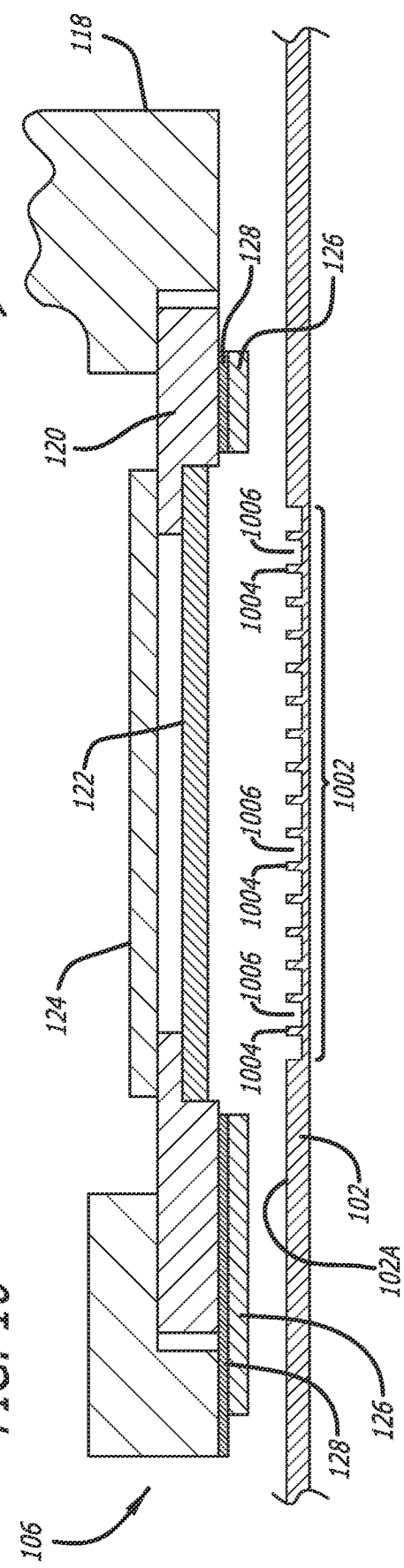

SENSOR TEMPERATURE REDUCER FOR A SENSOR SHIFT CAMERA ARCHITECTURE

FIELD

An aspect of the disclosure is directed to a passive heat exchanger for reducing peak sensor temperatures in sensor shift cameras. Other aspects are also described and claimed.

BACKGROUND

The use of small portable multipurpose devices such as smartphones and tablet or pad devices has resulted in a need for high-resolution, small form factor or miniature cameras for integration in the devices. Some of these cameras may incorporate optical image stabilization (OIS) mechanisms that may sense and react to external excitation/disturbance by adjusting a location of the optical lens on the X and/or Y axis in an attempt to compensate for unwanted motion of the lens. In addition, the cameras may incorporate an autofocus (AF) mechanism whereby the object focal distance is adjusted to allow objects at different distances to be in sharp focus and captured by the digital image sensor. In some such autofocus mechanisms, the optical lens is moved relative to the digital image sensor along the optical axis of the camera to refocus the camera. Due to the small form factor of the cameras, however, unintended movements, which may occur when the device is dropped, can cause camera components to collide and become damaged resulting in reduced camera reliability.

SUMMARY

In one aspect, the disclosure is directed to a heat dissipating mechanism in a camera module that dissipates heat from the sensor package within the camera module (e.g., image sensor) through a conductive path. Representatively, the camera assembly disclosed herein may include an image sensor assembly that moves while the optical components remain fixed. The image sensor assembly, however, takes in light and may be made up of a number of electronic components that causes the image sensor assembly to transmit a lot of heat. The moving image sensor may therefore be prone to overheating if the heat it is generated cannot be dissipated. The fastest way to dissipate heat is through a conductive pathway. This can be difficult with the moving image sensor architecture, however, because the sensor assembly is "floating" above the bottom enclosure wall. The image sensor therefore does not rest on a conductive surface that could otherwise provide a strong conduction path. To address this, aspects of the instant disclosure provide a passive heat exchanger or reduction mechanism that can create a conductive pathway from the moving image sensor to help dissipate heat from the moving image sensor and reduce peak sensor temperatures. For example, in some aspects, the heat exchange or reduction mechanism may reduce the peak sensor temperature so that it does not exceed seventy degrees.

Representatively, an aspect of the disclosure is directed to a camera including a camera enclosure; an optomechanical assembly fixedly coupled to the camera enclosure; an image sensor assembly movably coupled to the camera enclosure, the image sensor assembly comprising: a substrate, an image sensor coupled to the substrate, a flexible printed circuit board coupled to the substrate, a conductive stiffener plate coupled to the flexible printed circuit board, and a passive heat exchanger thermally coupled to the image sensor to dissipate heat away from the image sensor. In one aspect, the passive heat exchanger includes a thermally conductive gel contacting the image sensor and the conductive stiffener plate to form a conductive pathway that dissipates the heat away from the image sensor. In another aspect, the passive heat exchanger comprises a layer of thermally conductive material contacting a bottom side of the image sensor and a top side of the conductive stiffener plate. In another aspect, the flexible printed circuit board extends entirely across a bottom side of the image sensor, and the passive heat exchanger comprises a layer of thermally conductive material contacting the bottom side of the image sensor and a top side of the flexible printed circuit board. In another aspect, a conductive stiffener plate is coupled to a bottom side of the flexible printed circuit board and extends entirely across the bottom side of the image sensor. In another aspect, a passive heat exchanger includes a thermally conductive gel connected to a bottom side of the image sensor and a top side of the camera enclosure. In another aspect, a flexible printed circuit board and the conductive stiffener plate extend entirely across a bottom side of the image sensor, and the passive heat exchanger includes a number of heat sink fins formed in a portion of the conductive stiffener plate directly below the image sensor. In some aspects, the passive heat exchanger includes a heat sink directly attached to a bottom side of the image sensor. In another aspect, the passive heat exchanger includes a heat sink attached to an interior side of the camera enclosure. In some aspects, the heat sink includes a number of heat sink fins formed in an interior side of the camera enclosure and directly below the image sensor.

In another aspect, a camera image sensor assembly includes a substrate movably coupled to a camera enclosure; an image sensor coupled to the substrate and having a bottom side suspended over an interior side of the camera enclosure; a flexible printed circuit board coupled to the substrate; a stiffener plate coupled to the flexible printed circuit board; and a passive heat exchanger thermally coupled to the image sensor to dissipate heat away from the image sensor. In some aspects, the stiffener plate includes a conductive portion that at least partially overlaps the bottom side of the image sensor and the passive heat exchanger is a thermally conductive gel positioned between the conductive portion of the stiffener plate and the bottom side of the image sensor. In some aspects, the passive heat exchanger includes a layer of thermally conductive gel completely covering the bottom side of the image sensor, the flexible printed circuit board is connected to the layer of thermally conductive gel, and the stiffener plate comprises a conductive material connected to the flexible printed circuit board. In some aspects, the flexible printed circuit board entirely overlaps the bottom side of the image sensor. In some aspects, the stiffener plate entirely overlaps the bottom side of the image sensor. In some aspects, the passive heat exchanger includes a thermally conductive gel extending from the bottom side of the image sensor to the interior side of the camera enclosure. In further aspects, the passive heat exchanger includes a heat sink positioned between the bottom side of the image sensor and the interior side of the camera enclosure. In another aspect, the heat sink is directly attached to the bottom side of the image sensor or the interior side of the camera enclosure. In still further aspects, the flexible printed circuit board and the stiffener plate entirely overlap the bottom side of the image sensor, and the passive heat exchanger comprises a number of heat sink fins formed in the stiffener plate. In some aspects, the passive heat exchanger comprises a number of heat sink fins formed in the interior side of the camera enclosure.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment in this disclosure are not necessarily to the same embodiment, and they mean at least one.

FIG. 7 illustrates a magnified cross-sectional side view of an aspect of a camera assembly.

FIG. 8 illustrates a magnified cross-sectional side view of an aspect of a camera assembly.

FIG. 9 illustrates a magnified cross-sectional side view of an aspect of a camera assembly.

FIG. 10 illustrates a magnified cross-sectional side view of an aspect of a camera assembly.

DETAILED DESCRIPTION

In this section we shall explain several preferred aspects of the disclosure with reference to the appended drawings. Whenever the shapes, relative positions and other aspects of the parts described in the aspects are not clearly defined, the scope of the disclosure is not limited only to the parts shown, which are meant merely for the purpose of illustration. Also, while numerous details are set forth, it is understood that some aspects of the disclosure may be practiced without these details. In other instances, well-known structures and techniques have not been shown in detail so as not to obscure the understanding of this description.

The terminology used herein is for the purpose of describing particular aspects only and is not intended to be limiting of the disclosure. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

The terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

Figure 1:
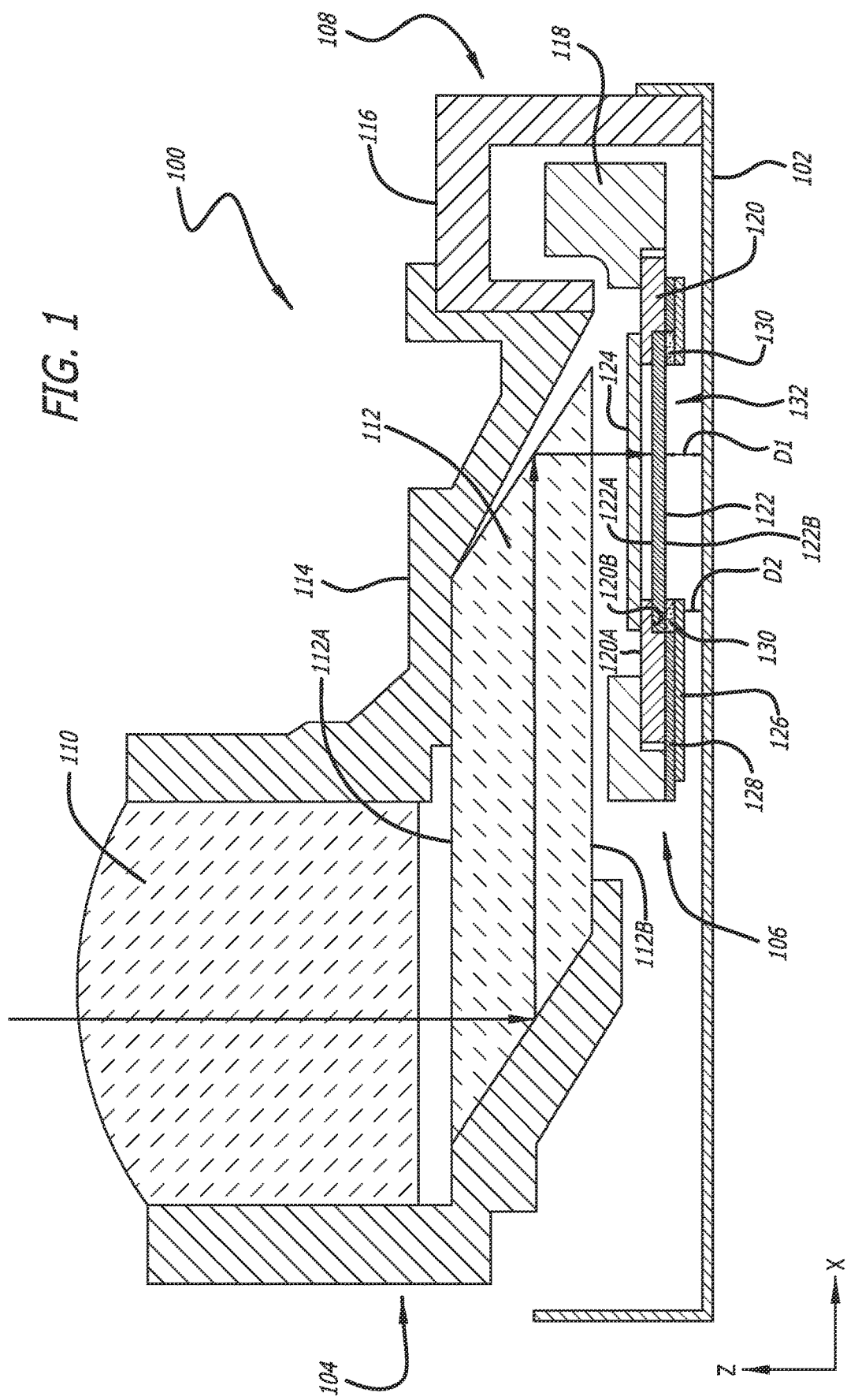
FIG. 1 illustrates a cross-sectional side view of an example camera assembly.

FIG. 1 illustrates a cross-sectional side view of a camera assembly or module within which any one or more of the aspects disclosed herein, alone or in combination, may be implemented. The example X-Y-Z coordinate system shown in FIG. 1 may be used to discuss aspects of the system and/or system components, and may apply to aspects described throughout the disclosure. Camera assembly 100 may include a camera housing or enclosure 102 having a wall that defines an enclosed space or chamber within which various components of the camera assembly are positioned or otherwise contained. Representatively, the various camera components may be positioned within the enclosed space and fixedly or movably connected to the enclosure 102. For example, the camera components may include an optomechanical assembly 104 including a number of optics components that are contained or otherwise coupled to the enclosure 102. The camera components may further include a sensor assembly 106 including a number of sensing components that are contained or otherwise coupled to the enclosure 102. The camera components may further include an actuator 108 that is operable to move the sensor assembly 106 relative to the optomechanical assembly 104 and/or enclosure 102 to provide OIS and/or AF functionality. Representatively, in some aspects, the optomechanical assembly 104 may be fixedly connected to the enclosure 102 by the actuator 108. The sensor assembly 106 may be movably connected to the enclosure 102 by actuator 108. The actuator 108 may be operable to move the sensor assembly 106 relative to the fixed optomechanical assembly 104 and enclosure 102 to provide the OIS and/or AF functionality. In this aspect, in some cases, the optomechanical assembly 104 and/or its associated components may be considered a fixed portion of the camera 100 while the sensor assembly 106 and/or its associated components may be considered a moving portion of the camera assembly 100.

Referring now in more detail to the optomechanical assembly 104, optomechanical assembly 104 may include a lens 110 (or lens group), a prism 112 and a support structure 114 that holds lens 110 in the desired arrangement relative to prism 112. For example, support structure 114 may hold lens 110 and prism 112 in an arrangement in which lens 110 is positioned above prism 112, and prism 112 is positioned above imaging assembly 104 (e.g., relative to the Z-axis). Lens 110 (or lens group) may include one or more lens elements having an optical axis (e.g., the Z-axis) along which the light entering the camera propagates and is directed toward prism 112. For example, as shown by the arrow, the light may enter an object side 112A of prism 112 (e.g., along the Z-axis) and be redirected along an optical path through prism 112 (e.g., along the X-axis) and out the image side 112B of prism 112 towards the imaging assembly 106 (e.g., along the Z-axis). Optomechanical assembly 104 may be fixedly connected to the camera enclosure 102 by actuator 108 as previously discussed.

Representatively, actuator 108 may, in some aspects, be a voice coil motor (VCM) actuator assembly or module including a base portion 116 and a carrier portion 118. Base portion 116 may be fixedly connected to the optomechanical assembly 104 and camera enclosure 102. For example, base portion 116 may be a substantially rigid structure (e.g., a plastic structure) that defines a periphery within which optomechanical assembly 104 is disposed. Representatively, base portion 116 may have multiple sides that surround and attach to the sides of optomechanical assembly 104. For example, one or more of the side walls of fixed base portion 116 may be attached to support structure 114 as shown in FIG. 1 to fixedly connect optomechanical assembly 104 to camera enclosure 102. Carrier portion 118 may be movably connected to the base portion 116 and camera enclosure 102. Carrier portion 118 may be moved relative to camera enclosure 102 and/or base portion 116 by actuating components (e.g., magnets and/or coils) of actuator 108.

Sensor assembly 106 may be movably connected to camera enclosure 102 by the movable carrier portion 118. Representatively, sensor assembly 106 may be an image sensor package including a stack up of a substrate 120, an image sensor 122, a flexible printed circuit board 128, a stiffener member or plate 126 and a cover 124. The image sensor 122 may be arranged within an opening of substrate 120 and secured within the opening by attaching a top side 122A of image sensor 122 to a bottom side 120B of substrate 120. Cover 124 may be positioned over image sensor 122 and attached to a top side 120A of substrate 120 as shown. The flexible printed circuit board 128 and stiffener member or plate 126 may be stacked along the bottom side 120B of substrate 120. For example, flexible printed circuit board 128 may be attached to the bottom side 120B of substrate 120, and stiffener member or plate 126 may be attached to a bottom side of flexible printed circuit board 128. In some aspects, flexible printed circuit board 128 may be made of a flexible polyimide material with copper traces. In still further aspects, stiffener member or plate 126 may be made of a stiffening material that can help to provide added rigidity and/or support to substrate 120. In addition, in some aspects, the stiffening material may be conductive or include conductive traces or pathways. For example, stiffener member or plate 126 may be made of steel or copper, or another relatively rigid material with steel or copper traces or pathways. In some aspects, electronic components (e.g., diodes, capacitors, low-dropout regulators (LDOs), etc.) may also be attached, mounted, embedded, or otherwise coupled to, substrate 120 to assist with the sensing function of image sensor 122. The movable carrier portion 118 may be connected to substrate 120 (e.g., mounted to top side 120A of substrate 120) and used to shift the sensor assembly 106 relative to optomechanical assembly 104 along multiple axes, e.g., to provide AF and/or OIS functionality. For example, carrier portion 118 may be a substantially rigid structure (e.g., a plastic structure) including a number of sides that define a periphery within which sensor assembly 106 is disposed. The carrier sides may be connected to opposite sides surfaces of sensor assembly 106 (e.g., sides of substrate 120) to secure sensor assembly 106 to carrier portion 118.

During an AF and/or OIS operation, movable carrier portion 118 may displace or shift sensor assembly 106 relative to optomechanical assembly 104 (and camera enclosure 102). For example, carrier portion 118 may displace or shift sensor assembly 106 in a direction parallel to the Z-axis, X-axis and/or Y-axis. To allow for such movements, sensor assembly 106 may be suspended by carrier portion 118 a distance (D1) above the bottom wall of enclosure 102 as shown. The spacing of sensor assembly 106 distance (D1) from a resting surface, however, can present challenges when trying to dissipate heat or otherwise prevent sensor assembly 106 from overheating. As previously discussed, due to the light transmission and the electronic components associated with sensor assembly 106, sensor assembly 106 may be prone to overheating. Although heat dissipation from sensor assembly 106 may occur by convection across distance (D1), this is not the fastest means for heat dissipation. A conductive pathway from sensor assembly 106 will dissipate heat at a faster rate than a convective pathway. Sensor assembly 106, however, is spaced a distance (e.g., distance (D1)) from any fixed surface of camera assembly 100 that could be used to provide a conductive pathway for faster heat dissipation.

This challenge is solved in camera assembly 100 by attaching a passive heat exchanger 130 to the moving sensor assembly 106. Passive heat exchanger 130 includes a conductive material that forms a conductive pathway for dissipating heat from sensor assembly 106. Representatively, passive heat exchanger 130 may be directly connected to image sensor 122 to form a conductive pathway that can transfer heat away from sensor 122 and toward enclosure 102. For example, the conductive pathway may extend a substantial length of the distance (D1), or the entire length, such that any remaining pathway for heat transfer, for example by conduction, is substantially reduced to a distance (D2). In this aspect, passive heat exchanger 130 forms a conductive pathway that increases a rate of heat dissipation from image sensor 122 and a substantially reduced gap for dissipating the heat by convection the remaining distance (D2) to enclosure 102.

Figure 2:
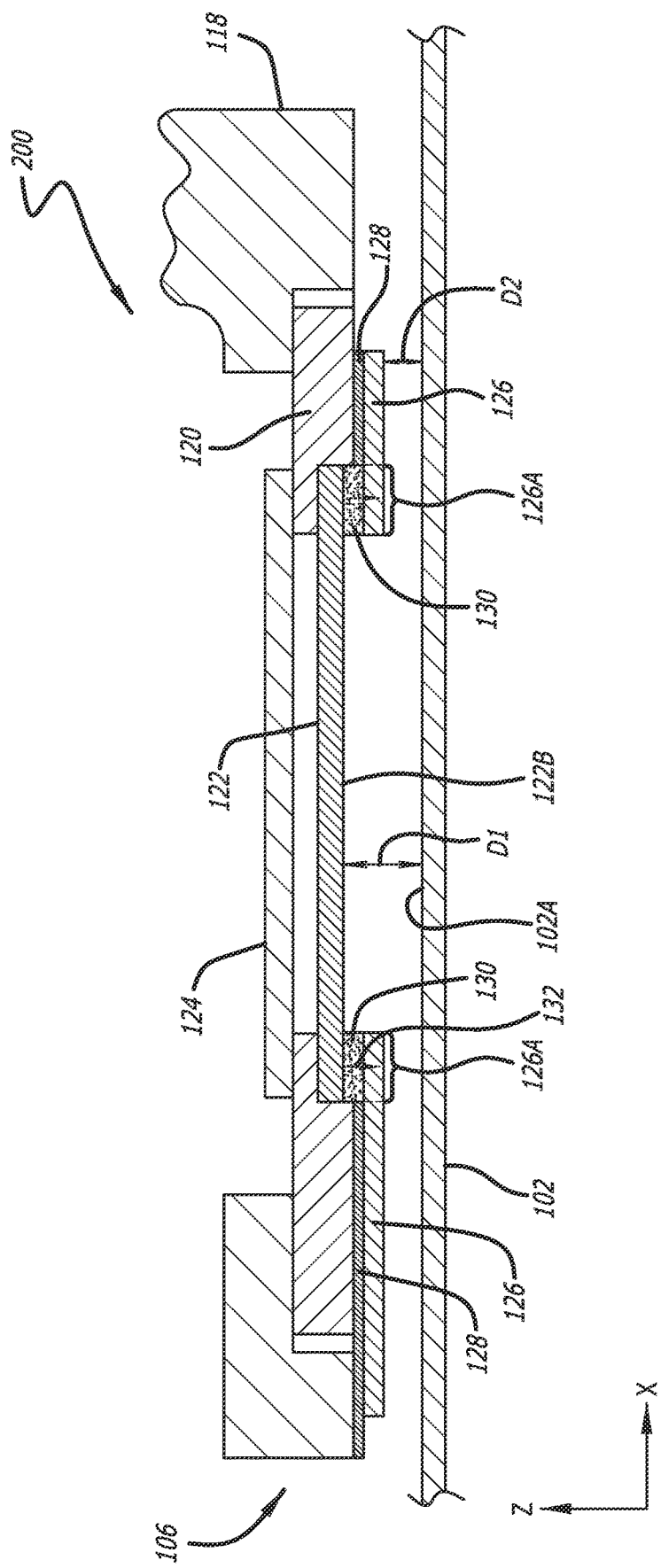
FIG. 2 illustrates a magnified cross-sectional side view of some representative aspects of the camera assembly of FIG. 1.

Referring now in more detail to the passive heat exchanger, FIG. 2 illustrates a magnified cross-sectional view of the image sensor assembly 106 including passive heat exchanger 130 of FIG. 1. From this view, it can be seen that passive heat exchanger 130 is directly attached to the bottom side 122B of image sensor 122. The passive heat exchanger 130 is further directly attached to a top side of an extended portion 126A of stiffener member or plate 126. Representatively, stiffener member or plate 126 may include an extended portion 126A that at least partially overlaps the bottom side 122B of image sensor 122. Passive heat exchanger 130 may be positioned within this overlapping region to provide a conductive pathway from image sensor 122 through stiffener plate or member 126. Passive heat exchanger 130 may, for example, be any sort of thermally conductive material or structure that provides a conductive pathway from image sensor 122. Representatively, in one aspect, passive heat exchanger 130 may be a soft and thermally conductive material such as a gel. The thermally conductive gel may be applied between the bottom side 122B of image sensor 122 and the top side of stiffener plate or member 126 as shown. The soft thermal gel bridges the gap between image sensor 122 and member 126. In this aspect, when the image sensor heats up, the thermal gel wicks the heat away from image sensor 122 and through member 126 along a conductive pathway 132. As previously discussed, stiffener plate or member 126 may be made of, or otherwise include, a conductive material (e.g., a copper) as well. Thus, conductive pathway 132 extends through and to the bottom side of member 126. Any heat remaining after passing along conductive pathway 132 through the gel and member 126 is dissipated the remaining distance (D2) by convention to enclosure 102. As previously discussed, this remaining distance (D2) from member 126 to enclosure 102 is much smaller than the distance (D1) from image sensor 122 to enclosure 102. The convective pathway (e.g., along arrow D2) that remains for heat transfer out of the system (e.g., to enclosure 102) is therefore reduced resulting in a further improvement in the rate of heat dissipation from image sensor 122. For example, passive heat exchanger 130 may dissipate heat from the moving image sensor 122 and reduce peak sensor temperatures. Representatively, in some aspects, passive heat exchanger 130 may reduce the peak sensor temperature so that it does not exceed seventy degrees.

In some aspects, the thermal gel forming passive heat exchanger 130 may be confined to the region of image sensor 122 that is overlapped by the extended portion 126A of member 126. For example, the thermal gel may only partially cover the bottom side 122B of sensor 122 and does not extend across the entire bottom side 122B of sensor 122. In addition, the thermal gel may have any thickness suitable for occupying the entire space between the bottom side 122B of image sensor 122 and the top side of portion 126A. In this aspect, as shown by the arrow, conductive pathway 132 may run entirely through thermal gel to the bottom side of member 126. Still further, in some aspects, a thickness of the thermal gel and/or member 126 may be increased to increase the length of the conductive pathway 132 and further reduce the distance (D2) of the convective pathway to the enclosure 102. It should further be understood that although a thermal gel is described, any sort of relatively soft thermally conductive material suitable for transferring heat from image sensor 122 to member 126 could be used.

Figure 3:
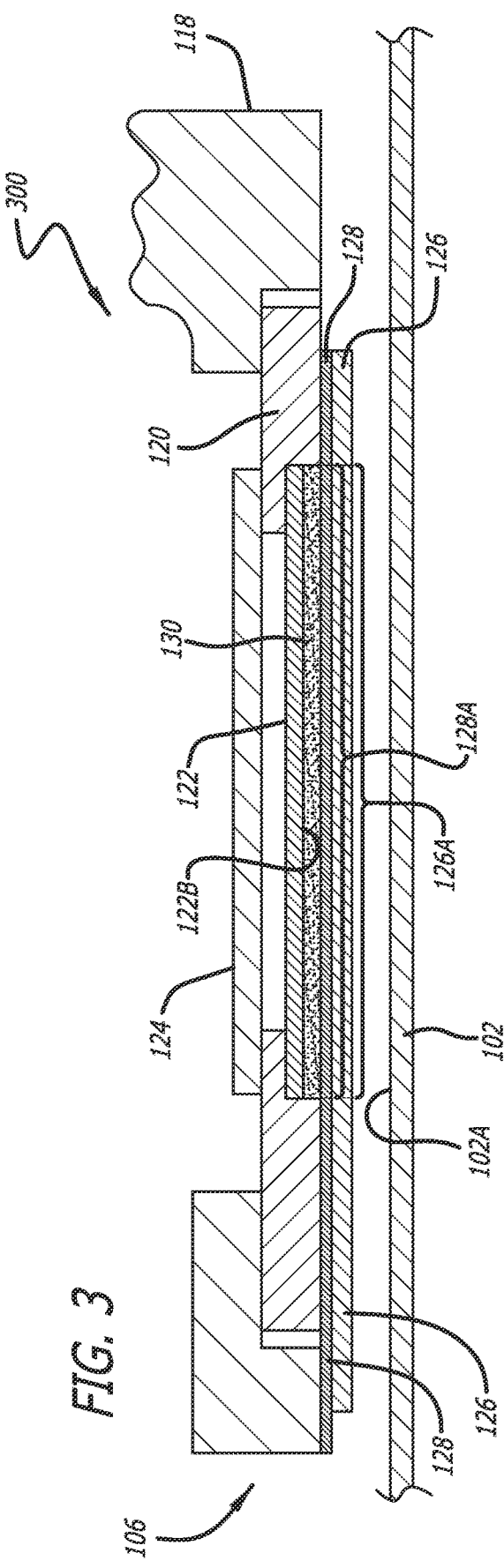
FIG. 3 illustrates a magnified cross-sectional side view of an aspect of a camera assembly.

Referring now to FIG. 3, FIG. 3 illustrates a magnified cross-sectional side view of an aspect of a camera assembly. Representatively, camera assembly 300 is a magnified view of another aspect of an image sensor assembly and passive heat exchanger that could be implemented in the camera assembly previously discussed in reference to FIG. 1. The image sensor assembly 106 is similar to the previously discussed image sensor assemblies in that it includes a substrate 120, an image sensor 122, a flexible printed circuit board 128, a stiffener member or plate 126 and a cover 124. The flexible printed circuit board 128 and stiffener member or plate 126 may be stacked along the bottom side of substrate 120. For example, flexible printed circuit board 128 may be attached to the bottom side of substrate 120, and stiffener member or plate 126 may be attached to the bottom side of flexible printed circuit board 128, as previously discussed. In some aspects, stiffener member or plate 126 may be made of a stiffening material that can help to provide added rigidity to substrate 120. In addition, in some aspects, the stiffening material may be conductive or include conductive traces or pathways. For example, stiffener member or plate 126 may be made of steel or copper, or another relatively rigid material with steel or copper traces or pathways. The movable carrier portion 118 may be connected to substrate 120 and used to shift the sensor assembly 106 relative to optomechanical assembly 104 (shown in FIG. 1) along multiple axes, e.g., to provide AF and/or OIS functionality, as previously discussed.

In image sensor assembly 106 of camera assembly 300, however, the flexible printed circuit board 128 and the stiffener member or plate 126 entirely overlap, or extend entirely across, the bottom side 122B of image sensor 122. Representatively, flexible printed circuit board 128 includes extended portion 128A and stiffener member or plate 126 includes extended portion 126A that entirely overlap the image sensor 122. In addition, passive heat exchanger 130 also entirely overlaps, or extends entirely across, the bottom side 122B of image sensor 122. For example, passive heat exchanger 130 may be a thermally conductive gel as previously discussed, that contacts and is applied entirely across the bottom side 122B of image sensor 122. The extended portion 128A of flexible printed circuit board 128 extends across, and contacts, the bottom side of substrate 120 and the thermally conductive gel. The extended portion 126A of stiffener member or plate 126 extends across, and contacts, the bottom side of flexible printed circuit board 128. Similar to the previously discussed configuration, the stack up of the passive heat exchanger 130, flexible printed circuit board 128 and stiffener member or plate 126 forms a conductive pathway (e.g., similar to conductive pathway 132) for heat dissipation away from image sensor 122. In addition, in some aspects, the increased surface area of sensor 122 that is in contact with the thermally conductive gel may further increase the rate of heat transfer away from image sensor 122. As previously discussed, once the heat is transferred through the conductive pathway to the bottom side of stiffener member or plate 126, it can pass through the convective pathway between plate 126 and enclosure 102, to enclosure 102 and out of the system. The combination of the conductive pathway and reduced convective pathway helps to increase the rate of heat dissipation and reduce the peak sensor temperature.

Figure 4:
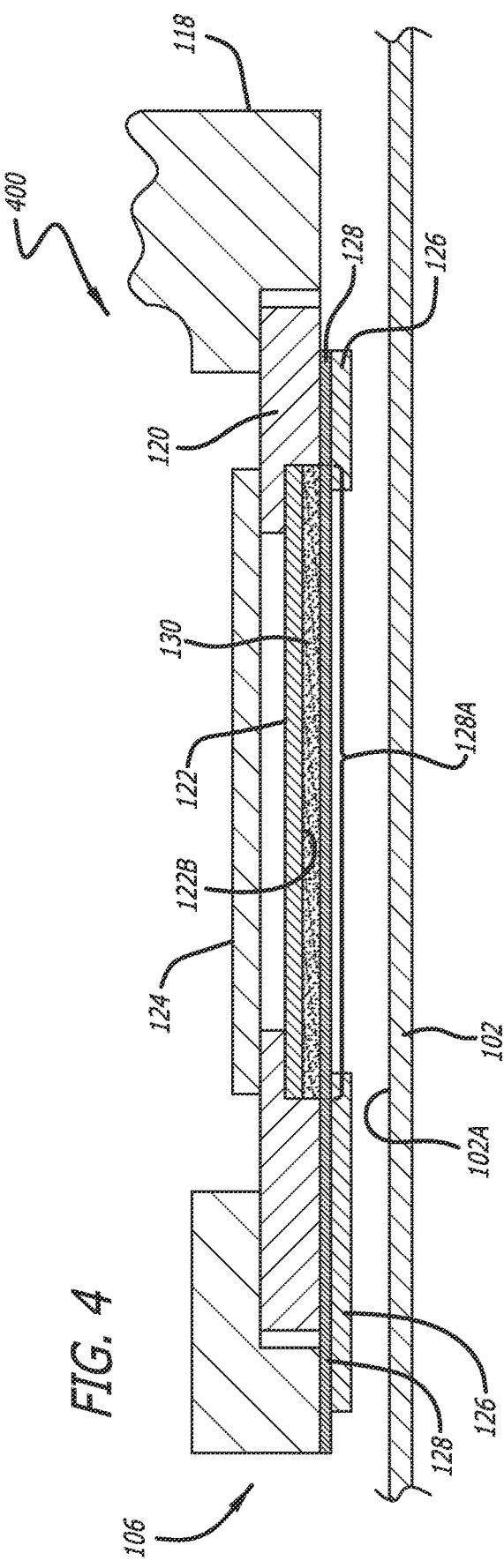
FIG. 4 illustrates a magnified cross-sectional side view of an aspect of a camera assembly.

Referring now to FIG. 4, FIG. 4 illustrates a magnified cross-sectional side view of an aspect of a camera assembly. Representatively, camera assembly 400 is a magnified view of another aspect of an image sensor assembly and passive heat exchanger that could be implemented in the camera assembly previously discussed in reference to FIG. 1. The image sensor assembly 106 is similar to the previously discussed image sensor assemblies in that it includes a substrate 120, an image sensor 122, a flexible printed circuit board 128, a stiffener member or plate 126 and a cover 124. The flexible printed circuit board 128 and stiffener member or plate 126 may be stacked along the bottom side (e.g., along side 120B of FIG. 1) of substrate 120. The movable carrier portion 118 may be connected to substrate 120 and used to shift the sensor assembly 106 relative to optomechanical assembly 104 along multiple axes, e.g., to provide AF and/or OIS functionality, as previously discussed.

In image sensor assembly 106 of camera assembly 400, however, the flexible printed circuit board 128 entirely overlaps, or extends entirely across, the bottom side 122B of image sensor 122. Representatively, flexible printed circuit board 128 includes extended portion 128A that entirely overlaps the image sensor 122. In addition, passive heat exchanger 130 also entirely overlaps, or extends entirely across, the bottom side 122B of image sensor 122. For example, passive heat exchanger 130 may be a thermally conductive gel as previously discussed, that is applied entirely across the bottom side 122B of image sensor 122. The extended portion 128A of flexible printed circuit board 128 extends across, and contacts, the bottom side of substrate 120 and the thermally conductive gel In contrast to FIG. 3, however, the stiffener member or plate 126 does not extend entirely across the bottom side of the flexible printed circuit board 128 and/or image sensor 122. Rather, stiffener member or plate 126 only partially overlaps the bottom side of flexible printed circuit board 128 and image sensor 122. For example, stiffener member of plate 126 may be similar to the stiffener member or plate 126 described in FIG. 2. Similar to the previously discussed configuration, the stack up of the passive heat exchanger 130 and flexible printed circuit board 128 may form a conductive pathway for heat dissipation away from image sensor 122. In some aspects, the conductive pathway may be similar to the conductive pathway 132 described in reference to FIG. 2 and extend in the Z-axis direction from the bottom side of image sensor 122, through printed circuit board 128 to the bottom side of plate 126. In other aspects, the conductive pathway may extend vertically (in the Z-axis direction) through the passive heat exchanger 130 and the flexible printed circuit board 128, then horizontally (in the X-axis direction) through stiffener member or plate 126 contacting a portion of flexible printed circuit board 128 then out the bottom side of plate 126 (in the Z-axis direction). As previously discussed, once the heat is transferred through the conductive pathway to the bottom side of stiffener member or plate 126, it can pass through the convective pathway between plate 126 and enclosure 102, to enclosure 102 and out of the system. The combination of the conductive pathway and reduced convective pathway helps to increase the rate of heat dissipation and reduce the peak sensor temperature. In addition, in some aspects, the increased surface area contact between the thermally conductive gel and the image sensor 122 further increases the rate of heat dissipation away from image sensor 122.

Figure 5:
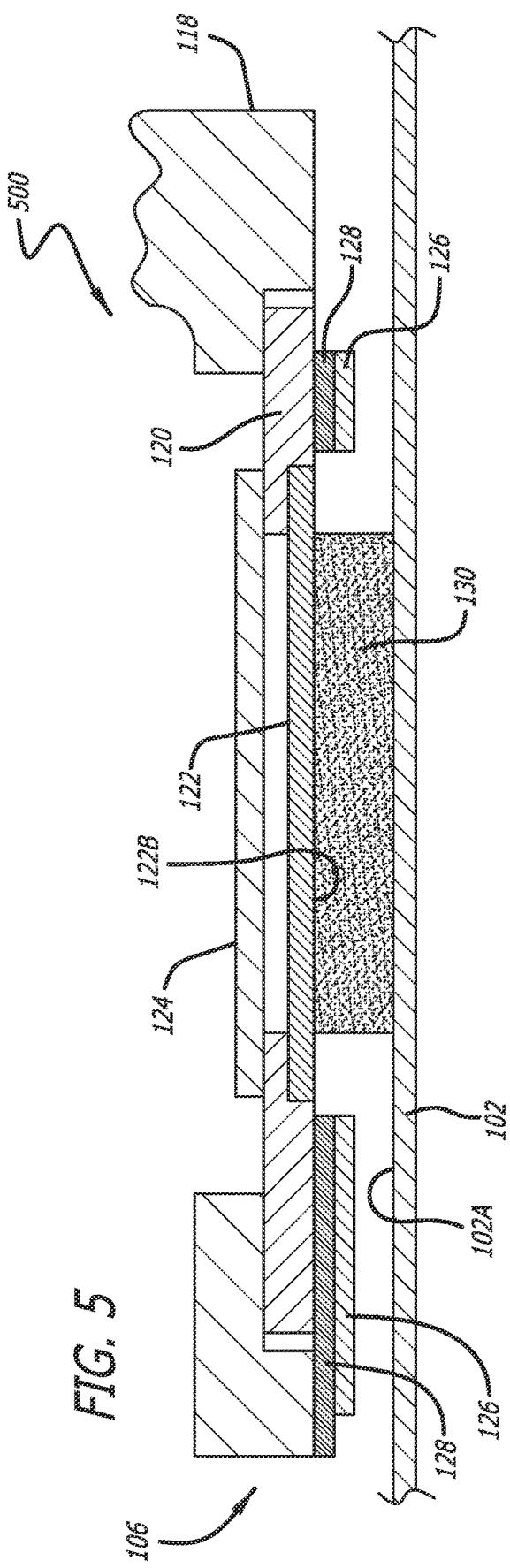
FIG. 5 illustrates a magnified cross-sectional side view of an aspect of a camera assembly.
Figure 6:
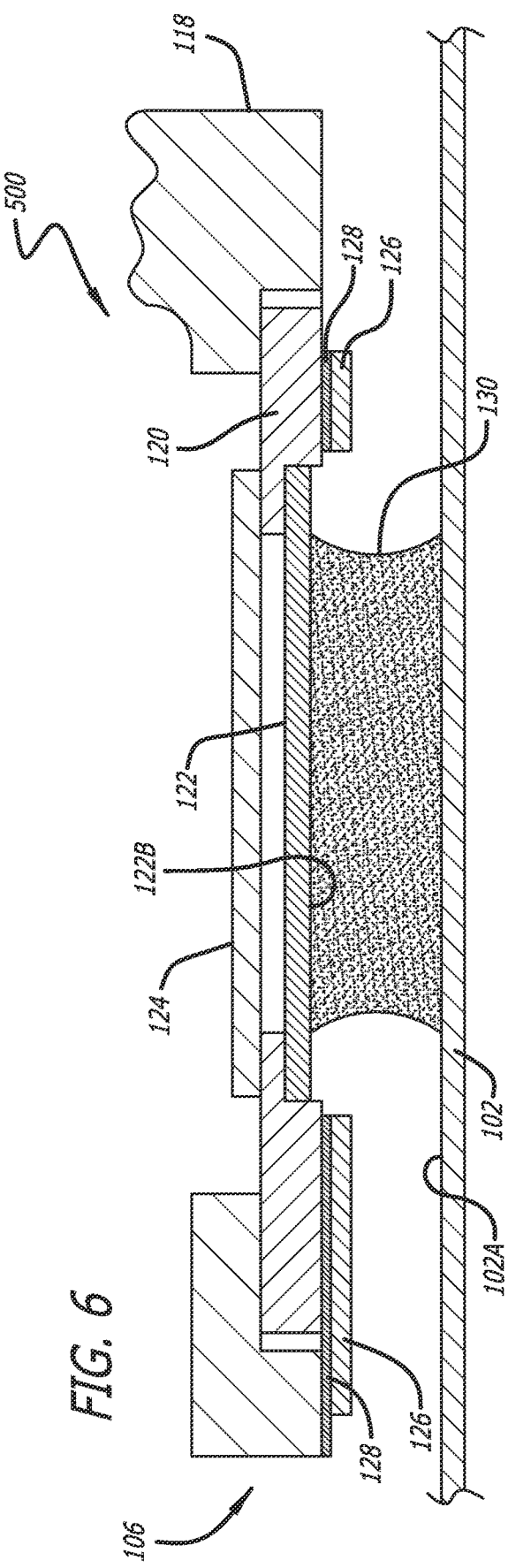
FIG. 6 illustrates a magnified cross-sectional side view of an aspect of the camera assembly of FIG. 5.

Referring now to FIG. 5, FIG. 5 illustrates a magnified cross-sectional side view of an aspect of a camera assembly. Representatively, camera assembly 500 is a magnified view of another aspect of an image sensor assembly and passive heat exchanger that could be implemented in the camera assembly previously discussed in reference to FIG. 1. The image sensor assembly 106 is similar to the previously discussed image sensor assemblies in that it includes a substrate 120, an image sensor 122, a flexible printed circuit board 128, a stiffener member or plate 126 and a cover 124. The flexible printed circuit board 128 and stiffener member or plate 126 may be stacked along the bottom side 120B of substrate 120. The movable carrier portion 118 may be connected to substrate 120 and used to shift the sensor assembly 106 relative to optomechanical assembly 104 along multiple axes, e.g., to provide AF and/or OIS functionality, as previously discussed.

In image sensor assembly 106 of camera assembly 500, however, the passive heat exchanger 130 contacts and extends entirely from the bottom side 122B of image sensor 122 to the interior side 102A of enclosure 102. In this aspect, the conductive pathway for dissipating heat away from image sensor 122 extends entirely from image sensor 122 to enclosure 102. In this aspect, enclosure 102 wicks heat away from image sensor 122 by conduction. For example, passive heat exchanger 130 may be a thermally conductive gel as previously discussed. The thermally conductive gel may be soft enough not to restrict movement of image sensor 122, yet firm enough and have enough of an adhesive characteristic to remain in contact with image sensor 122 and enclosure 102. Representatively, the thermally conductive gel may be like an adhesive so that it sticks to the surfaces of the image sensor 122 and enclosure 102. In this aspect, the thermally conductive gel moves with image sensor 122, and stays in contact with image sensor 122 and enclosure 102, such that it expands, contracts, etc. as image sensor 122 moves along the X, Y and/or Z-axes. Representatively, as illustrated in FIG. 5, when image sensor 122 moves along the Z-axis away from enclosure 102, the thermal gel remains in contact with the bottom side 122B of image sensor 122 and is caused to expand as shown. Similarly, if image sensor 122 is moved closer to interior side 102A of enclosure 102 the thermal gel will compress. Still further, if image sensor 122 is moved horizontally along the X-axis, the thermal gel will be pulled in the direction of image sensor 122 while always maintaining contact with image sensor 122 and enclosure 102 as shown. As a result, regardless of the movement of image sensor 122, there is always a conductive pathway across the entire space or gap between image sensor 122 and enclosure 102. This, in turn, substantially increases the rate of heat dissipation away from sensor 122 and the reduction in peak sensor temperature.

Referring now to FIG. 7. FIG. 7 illustrates a magnified cross-sectional side view of an aspect of a camera assembly. Representatively, camera assembly 700 is a magnified view of another aspect of an image sensor assembly and passive heat exchanger that could be implemented in the camera assembly previously discussed in reference to FIG. 1. The image sensor assembly 106 is similar to the previously discussed image sensor assemblies in that it includes a substrate 120, an image sensor 122, a flexible printed circuit board 128, a stiffener member or plate 126 and a cover 124. The flexible printed circuit board 128 and stiffener member or plate 126 may be stacked along the bottom side of substrate 120. For example, flexible printed circuit board 128 may be attached to the bottom side of substrate 120, and stiffener member or plate 126 may be attached to flexible printed circuit board 128, as previously discussed. In some aspects, stiffener member or plate 126 may be made of a stiffening material that can help to provide added rigidity to substrate 120. In addition, in some aspects, the stiffening material may be conductive or include conductive traces or pathways. For example, stiffener member or plate 126 may be made of a metal such as steel or copper. The movable carrier portion 118 may be connected to substrate 120 and used to shift the sensor assembly 106 relative to optomechanical assembly 104 (as illustrated in FIG. 1) along multiple axes, e.g., to provide AF and/or OIS functionality, as previously discussed.

In image sensor assembly 106 of camera assembly 700, the flexible printed circuit board 128 and the stiffener member or plate 126 entirely overlap, or extend entirely across, the bottom side of image sensor 122. In addition, passive heat exchanger 702 is formed within the portion of stiffener member or plate 126 overlapping image sensor 122. Representatively, stiffener member or plate 126 may be a metal plate and passive heat exchanger 702 may be a heat sink 702 that is formed in the bottom side of the metal plate. The heat sink 702 may, for example, include a number of pins or fins 704 that are separated by spaces or channels 706 formed in the bottom side of stiffener member or plate 126. For example, the pins or fins 704 may have a pin-fin or straight-fin type heat sink arrangement. Since the heat sink 702 is directly attached to the bottom side of sensor 122, it will create a conductive pathway drawing heat away from image sensor 122 and to the pins or fins 702. The increased surface area created by the pins or fins 704 will increase the convective surface area which further helps to increase the rate of heat dissipation away from the image sensor 122. It is contemplated that although a certain number of pins or fins 704 and channels 706, and a particular fin/channel arrangement, is shown any number of pins or fins 704 and channels 706 in any arrangement may be used.

Referring now to FIG. 8, FIG. 8 illustrates a magnified cross-sectional side view of an aspect of a camera assembly. Representatively, camera assembly 800 is a magnified view of another aspect of an image sensor assembly and passive heat exchanger that could be implemented in the camera assembly previously discussed in reference to FIG. 1. The image sensor assembly 106 is similar to the previously discussed image sensor assemblies in that it includes a substrate 120, an image sensor 122, a flexible printed circuit board 128, a stiffener member or plate 126 and a cover 124. The flexible printed circuit board 128 and stiffener member or plate 126 may be stacked along the bottom side of substrate 120. For example, flexible printed circuit board 128 may be attached to the bottom side of substrate 120, and stiffener member or plate 126 may be attached to flexible printed circuit board 128, as previously discussed. In some aspects, stiffener member or plate 126 may be made of a stiffening material that can help to provide added rigidity to substrate 120. In addition, in some aspects, the stiffening material may be conductive or include conductive traces or pathways. For example, stiffener member or plate 126 may be made of a metal such as steel or copper. The movable carrier portion 118 may be connected to substrate 120 and used to shift the sensor assembly 106 relative to optomechanical assembly 104 along multiple axes, e.g., to provide AF and/or OIS functionality, as previously discussed.

Image sensor assembly 106 may further include passive heat exchanger 802 attached to the bottom side 122B of image sensor 122, similar to the previously discussed configuration of FIG. 7. In this configuration, however, passive heat exchanger 802 is not formed within the stiffener member or plate 126. Rather, passive heat exchanger 802 is a heat sink that is separate from the flexible printed circuit board 128 and the stiffener member or plate 126, and directly attached to the bottom side 122B of image sensor 122. For example, flexible printed circuit board 128 and stiffener member or plate 126 are attached to the bottom side of substrate 120 but do not overlap image sensor 122. The heat sink 802 is then directly attached to the bottom side 122B of image sensor 122, between the ends of the circuit board 128 and plate 126. Representatively, heat sink 802 may include a number of pins or fins 804 that are separated by spaces or channels 806 formed in a metal plate or other conductive material that can then be attached to sensor 122. For example, the pins or fins 804 may have a pin-fin or straight-fin type heat sink arrangement. Since the heat sink 802 is directly attached to the bottom side of sensor 122, it will create a conductive pathway drawing heat away from image sensor 122 and to the pins or fins 804. The increased surface area created by the pins or fins 804 will help to transfer the heat generated by the image sensor 122 to the air, where it is dissipated away from the image sensor 122.

Referring now to FIG. 9, FIG. 9 illustrates a magnified cross-sectional side view of an aspect of a camera assembly. Representatively, camera assembly 900 is a magnified view of another aspect of an image sensor assembly and passive heat exchanger that could be implemented in the camera assembly previously discussed in reference to FIG. 1. The image sensor assembly 106 is similar to the previously discussed image sensor assemblies in that it includes a substrate 120, an image sensor 122, a flexible printed circuit board 128, a stiffener member or plate 126 and a cover 124. The flexible printed circuit board 128 and stiffener member or plate 126 may be stacked along the bottom side of substrate 120 as previously discussed. The movable carrier portion 118 may be connected to substrate 120 and used to shift the sensor assembly 106 relative to optomechanical assembly 104 along multiple axes, e.g., to provide AF and/or OIS functionality, as previously discussed.

Image sensor assembly 106 may further include passive heat exchanger 902. In this configuration, however, passive heat exchanger 902 is attached to the interior side 102A of enclosure 102. For example, passive heat exchanger 902 may be a heat sink that is directly below image sensor 122 and attached to the interior side 102A of enclosure 102. Representatively, the heat sink may include a number of pins or fins 904 that are separated by spaces or channels 906 formed in a metal plate or other metal structure that can be attached or mounted to the interior side 102A of enclosure 102. For example, pins or fins 904 may have a pin-fin or straight-fin type heat sink arrangement. Since the heat sink 902 is positioned below image sensor 122, heat emitted from image sensor 122 will reach heat sink 902 by way of convection across the gap or space and be transferred away from image sensor 122 to the enclosure 102. The increased surface area created by the pins or fins 904 will help to wick away and transfer the heat generated by the image sensor 122 to the enclosure 102.

Referring now to FIG. 10, FIG. 10 illustrates a magnified cross-sectional side view of an aspect of a camera assembly. Representatively, camera assembly 1000 is a magnified view of another aspect of an image sensor assembly and passive heat exchanger that could be implemented in the camera assembly previously discussed in reference to FIG. 1. The image sensor assembly 106 is similar to the previously discussed image sensor assemblies in that it includes a substrate 120, an image sensor 122, a flexible printed circuit board 128, a stiffener member or plate 126 and a cover 124. The flexible printed circuit board 128 and stiffener member or plate 126 may be stacked along the bottom side of substrate 120 as previously discussed. The movable carrier portion 118 may be connected to substrate 120 and used to shift the sensor assembly 106 relative to optomechanical assembly 104 along multiple axes, e.g., to provide AF and/or OIS functionality, as previously discussed.

Image sensor assembly 106 may further include passive heat exchanger 1002. In this configuration, however, passive heat exchanger 1002 is formed into the interior side 102A of enclosure 102. For example, passive heat exchanger 1002 may be a heat sink that is directly below image sensor 122 and formed in the interior side 102A of enclosure 102. Representatively, the heat sink may include a number of pins or fins 1004 that are separated by spaces or channels 1006 formed in the interior side 102A of enclosure 102. For example, the pins or fins 1004 may have a pin-fin or straight-fin type heat sink arrangement. The pins or fins 1004 and channels 1006 may be formed within the enclosure 102 by a metal forming process. Since the heat sink 1002 is positioned below image sensor 122, heat emitted from image sensor 122 will reach heat sink 1002 and be transferred away from image sensor 122 to the enclosure 102. The increased surface area created by the pins or fins 1004 will help to transfer the heat generated by the image sensor 122 to the enclosure 102.

Figure 11:
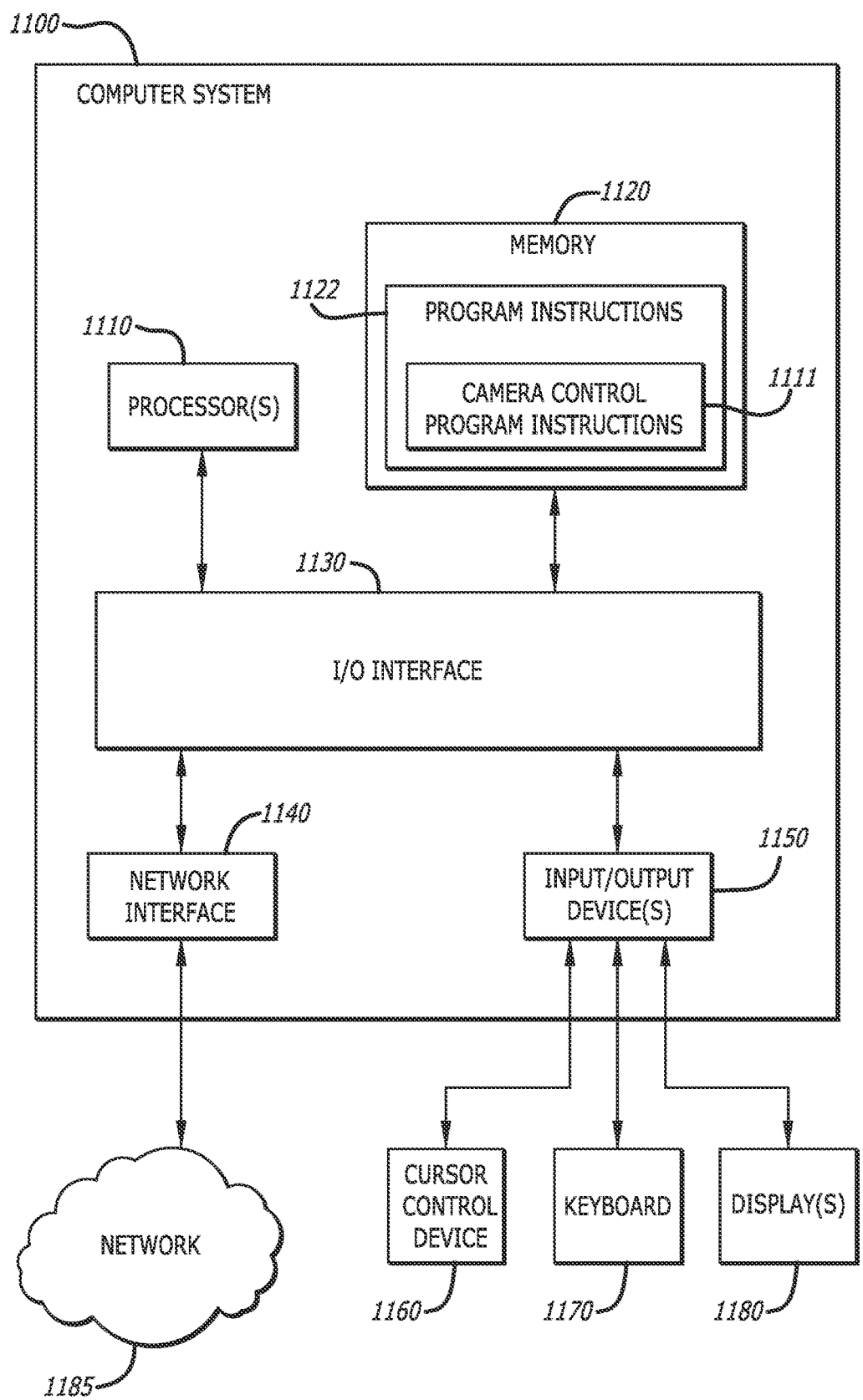
FIG. 11 illustrates an example computer system that may include a camera assembly as disclosed herein.

Referring now to FIG. 11, FIG. 11 illustrates an example computer system that may include a camera, in accordance with aspects disclosed herein. Representatively, FIG. 11 illustrates an example computer system 1100 that may include one or multiple features, components, and/or functionality of the aspects described herein with reference to FIGS. 1-10. The computer system 1100 may be configured to execute any or all of the aspects described herein. In some aspects, computer system 1100 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various aspects of a camera system as described herein, including aspects for actuating the camera system using a voice coil motor, as described herein may be executed in one or more computer systems 1100, which may interact with various other devices. Note that any component, action, or functionality described above with respect to FIGS. 1-10 may be implemented on one or more computers configured as computer system 1100 of FIG. 11. Representatively, computer system 1100 may include one or more processors 1110 coupled to a system memory 1120 via an input/output (I/O) interface 1130. Computer system 1100 may further include a network interface 1140 coupled to I/O interface 1130, and one or more input/output devices 1150, such as cursor control device 1160, keyboard 1170, and display(s) 1180. In some cases, it is contemplated that aspects may be implemented using a single instance of computer system 1100, while in other embodiments multiple such systems, or multiple nodes making up computer system 1100, may be configured to host different portions or instances of aspects disclosed herein. For example, in one aspect, some elements may be implemented via one or more nodes of computer system 1100 that are distinct from those nodes implementing other elements.

In various aspects, computer system 1100 may be a uniprocessor system including one processor 1110, or a multiprocessor system including several processors 1110 (e.g., two, four, eight, or another suitable number). Processors 1110 may be any suitable processor capable of executing instructions. For example, in various aspects, processors 1110 may be general-purpose or embedded processors implementing any of a variety of instruction set architectures (ISAs), such as the x86, PowerPC, SPARC, or MIPS ISAs, or any other suitable ISA. In multiprocessor systems, each of processors 1110 may commonly, but not necessarily, implement the same ISA.

System memory 1120 may be configured to store camera control program instructions 1122 and/or camera control data accessible by processor 1110. In various aspects, system memory 1120 may be implemented using any suitable memory technology, such as static random access memory (SRAM), synchronous dynamic RAM (SDRAM), nonvolatile/Flash-type memory, or any other type of memory. In the illustrated aspect, program instructions 1122 may be configured to implement a lens control application 1124 incorporating any of the functionality described above. Additionally, existing camera control data 1132 of memory 1120 may include any of the information or data structures described above. In some aspects, program instructions and/or data may be received, sent or stored upon different types of computer-accessible media or on similar media separate from system memory 1120 or computer system 1100. While computer system 1100 is described as implementing the functionality of functional blocks of previous Figures, any of the functionality described herein may be implemented via such a computer system.

In one aspect, I/O interface 1130 may be configured to coordinate I/O traffic between processor 1110, system memory 1120, and any peripheral devices in the device, including network interface 1140 or other peripheral interfaces, such as input/output devices 1150. In some embodiments, I/O interface 1130 may perform any necessary protocol, timing or other data transformations to convert data signals from one component (e.g., system memory 1120) into a format suitable for use by another component (e.g., processor 1110). In some embodiments, I/O interface 1130 may include support for devices attached through various types of peripheral buses, such as a variant of the Peripheral Component Interconnect (PCI) bus standard or the Universal Serial Bus (USB) standard, for example. In some aspects, the function of I/O interface 1130 may be split into two or more separate components, such as a north bridge and a south bridge, for example. Also, in some embodiments some or all of the functionality of I/O interface 1130, such as an interface to system memory 1120, may be incorporated directly into processor 1110.

Network interface 1140 may be configured to allow data to be exchanged between computer system 1100 and other devices attached to a network 1185 (e.g., carrier or agent devices) or between nodes of computer system 1100. Network 1185 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1140 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1150 may, in some aspects, include one or more display terminals, keyboards, keypads, touchpads, scanning devices, voice or optical recognition devices, or any other devices suitable for entering or accessing data by one or more computer systems 1100. Multiple input/output devices 1150 may be present in computer system 1100 or may be distributed on various nodes of computer system 1100. In some aspects, similar input/output devices may be separate from computer system 1100 and may interact with one or more nodes of computer system 1100 through a wired or wireless connection, such as over network interface 1140.

As shown in FIG. 11, memory 1120 may include program instructions 1122, which may be processor-executable to implement any element or action described above. In one embodiment, the program instructions may implement the methods described above. In other embodiments, different elements and data may be included. Note that data may include any data or information described above.

Those skilled in the art will appreciate that computer system 1100 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 1100 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

While certain aspects have been described and shown in the accompanying drawings, it is to be understood that such embodiments are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting. For example, although the drawings illustrate a combination of aspects and elements, any one or more of the aspects or elements may be optional and/or combined with aspects or elements from other drawings. In addition, to aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What is claimed is:

1. A camera comprising:
   a camera enclosure;
   an optomechanical assembly fixedly coupled to the camera enclosure;
   an image sensor assembly movably coupled to the camera enclosure, the image sensor assembly comprising:
   a substrate,
   an image sensor coupled to the substrate,
   a flexible printed circuit board coupled to the substrate,
   a conductive stiffener plate coupled to the flexible printed circuit board, and
   a passive heat exchanger comprising a thermally conductive gel contacting the image sensor and the conductive stiffener plate to form a conductive pathway that dissipates heat away from the image sensor.

2. The camera of claim 1 wherein the passive heat exchanger contacts a bottom side of the image sensor and a top side of the conductive stiffener plate.

3. A camera image sensor assembly comprising:
   a substrate movably coupled to a camera enclosure;
   an image sensor coupled to the substrate and having a bottom side suspended over an interior side of the camera enclosure;
   a flexible printed circuit board coupled to the substrate;
   a stiffener plate coupled to the flexible printed circuit board; and
   a passive heat exchanger comprising a thermally conductive gel contacting the image sensor and the stiffener plate to dissipate heat away from the image sensor.

4. The camera image sensor assembly of claim 3 wherein the stiffener plate comprises a conductive portion that at least partially overlaps the bottom side of the image sensor and the thermally conductive gel is positioned between the conductive portion of the stiffener plate and the bottom side of the image sensor.

* * * * *